(12) United States Patent
Zhu et al.

(10) Patent No.: US 8,160,275 B2
(45) Date of Patent: Apr. 17, 2012

(54) APPARATUS AND METHOD FOR AN INTEGRATED, MULTI-MODE, MULTI-BAND, AND MULTI-STAGE POWER AMPLIFIER

(75) Inventors: Xu Zhu, Allen, TX (US); Michael L. Brobston, Allen, TX (US); Lup M. Loh, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 786 days.

(21) Appl. No.: 12/288,030

(22) Filed: Oct. 16, 2008

(65) Prior Publication Data

US 2011/0065472 A1  Mar. 17, 2011

Related U.S. Application Data

(60) Provisional application No. 61/071,424, filed on Apr. 28, 2008.

(51) Int. Cl.
*H03G 3/00* (2006.01)

(52) U.S. Cl. ............ 381/104; 381/120; 381/311; 330/3; 330/150; 330/302; 330/305; 455/280; 455/292

(58) Field of Classification Search .................. 381/104, 381/120, 311; 330/3, 4, 5, 150, 302, 305; 445/280, 292
See application file for complete search history.

(56) References Cited

U.S. PATENT DOCUMENTS

| | | | | |
|---|---|---|---|---|
| 1,449,382 A * | 3/1923 | Carson | ........................... | 370/277 |
| 4,411,021 A * | 10/1983 | Yoakum | ......................... | 455/222 |
| 6,647,065 B1 * | 11/2003 | Auvolat | ......................... | 375/257 |
| 7,299,028 B2 * | 11/2007 | Kim | .............................. | 455/318 |

* cited by examiner

*Primary Examiner* — Thanh V Pham

(57) ABSTRACT

An apparatus and method for amplifying a transmission signals in multiple modes and multiple bands. The apparatus includes a tunable power amplifying module adapted to receive a plurality of signal types comprising multiple modes and multiple bands. The tunable power amplifying module includes a first and second power amplifier stages and a number of tunable matching networks configured to optimize an impedance value based on the mode and band of the signal to be amplified.

14 Claims, 20 Drawing Sheets

APPARATUS AND METHOD FOR AN INTEGRATED, MULTI-MODE, MULTI-BAND, AND MULTI-STAGE POWER AMPLIFIER

CROSS-REFERENCE TO RELATED APPLICATION(S) AND CLAIM OF PRIORITY

The present application is related to U.S. Provisional Patent No. 61/071,424, filed Apr. 28, 2008, entitled "INTEGRATED TUNABLE MULTI MODE MULTI-BAND POWER AMPLIFIER MODULE ENABLED BY MEMS TECHNOLOGY". Provisional Patent No. 61/071,424 is assigned to the assignee of the present application and is hereby incorporated by reference into the present application as if fully set forth herein. The present application hereby claims priority under 35 U.S.C. §119(e) to U.S. Provisional Patent No. 61/071,424.

TECHNICAL FIELD OF THE INVENTION

The present application relates generally to wireless communications devices and, more specifically, to a power amplifier for a wireless communication device.

BACKGROUND OF THE INVENTION

Wireless handsets are increasingly required to operate in multiple modes such as Global System for Mobile communications ("GSM")/Global Packet Radio Service ("GPRS"), Enhanced Data rates for Global Evolution ("EDGE"), Code Division Multiple Access ("CDMA"), Wideband Code Division Multiple Access ("WCDMA")/High-Speed Packet Access ("HSPA"), and Long Term Evolution ("LTE"). The handsets are also increasingly required to operate in multiple frequency bands such as 700 Megahertz ("MHz"), 800 MHz, 900 MHz, 1700 MHz, 1800 MHz, 1900 MHz, 2100 MHz, and 2600 MHz bands. Multi-mode and multi-band handset models currently in use contain a separate dedicated power amplifier for each individual mode and band of operation.

The purpose for using dedicated power amplifier circuits for each band and mode is that the input and output match of the circuit must be optimized to achieve the best linearity and/or efficiency for the given mode or band of operation. Although the main transistor of the amplifier circuit is inherently broadband, the bandwidth of the amplifier circuit is typically made narrower by the input and output matching circuits. Therefore, to achieve acceptable linearity and efficiency, power amplifier circuits using fixed matching networks respectively tuned for the different bands and modes of operation are used in a wireless terminal. Using fixed matching networks, a semiconductor power transistor device can only efficiently transmit RF signals in a single mode and a single band.

No viable solution exists for a single power amplifier ("PA") to cover both GSM and CDMA modes because, in the GSM system, the PA transistor operates in saturated region, a much narrower bandwidth signal and time slotted; whereas in the CDMA system, the PA transistor has to operate at a more linear region in continuous time. This difference leads to very different impedance matching solutions at the output of a PA device. In a fixed impedance system design, such as used 50 ohm system, a fixed matching network cannot satisfy both modes simultaneously.

In terms of frequency coverage, a single power amplifier circuit typically can only cover either a low band (800 MHz/900 MHz), or a high band (1700 MHz/1800 MHz/1900 MHz), or a UMTS band (2100 MHz). The load impedance presented at the output of the power amplifier transistor can be quite different at various operating frequencies and a single fixed matching network cannot provide optimum matching for all potential frequency bands simultaneously. Therefore, multiple PAs are required in the multi-mode multi-band handset.

The ever decreasing form factor and ever increasing functionality demanded of wireless terminals creates conflicting challenges on front-end devices like number of PAs that can be installed. Currently, the handset board space limits the number of PAs to no more than four on even the most complicated handset units. Despite much effort within the industry to aggressively reduce device sizes, the fundamental physics and fabrication challenges prohibit the ability to reduce the device sizes at a pace necessary to accommodate the number of added functions within the handset unit. Not only do additional PA devices require more board space, the peripheral passive components around each PA device also require board space and increase proportionately with the number of PAs used.

Therefore, there is a need in the art for an improved power amplification method. In particular, there is a need for a power amplifier that is capable of amplifying multiple modes and multiple bands while minimizing board space requirements.

SUMMARY OF THE INVENTION

An APPARATUS capable of amplifying a signal in a wireless communication handset is provided. The APPARATUS comprises a first interface configured to receive an input signal; a first stage power amplifier coupled to the first interface; a first tunable matching network, coupled to the first stage power amplifier; a second stage power amplifier coupled to the first tunable matching network. The device further includes a second tunable matching network coupled to the second stage power amplifier. Further, the device includes a second interface coupled to said second tunable matching network, wherein the second interface outputs an amplified version of the signal A wireless communications handset is provided. The handset comprises a multi-mode multi-band tunable power amplifier module. The multi-mode multi-band tunable power amplifier module includes a first interface for receiving an input signal and a second interface for outputting an amplified version of the input signal. The multi-mode multi-band tunable power amplifier module further includes a broadband power amplifier stage and a final amplifier stage. Additionally, multi-mode multi-band tunable power amplifier module includes a plurality of tunable matching networks for varying an impedance value of the multi-mode multi-band tunable power amplifier module.

A method for amplifying a transmission signal is provided. The method comprises receiving a signal for amplification. The method further comprises amplifying the signal via an amplification path and varying an impedance of the amplification path. Additionally, the method includes outputting an amplified version of the signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIG. 1a through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless handset device.

Figure 1A:
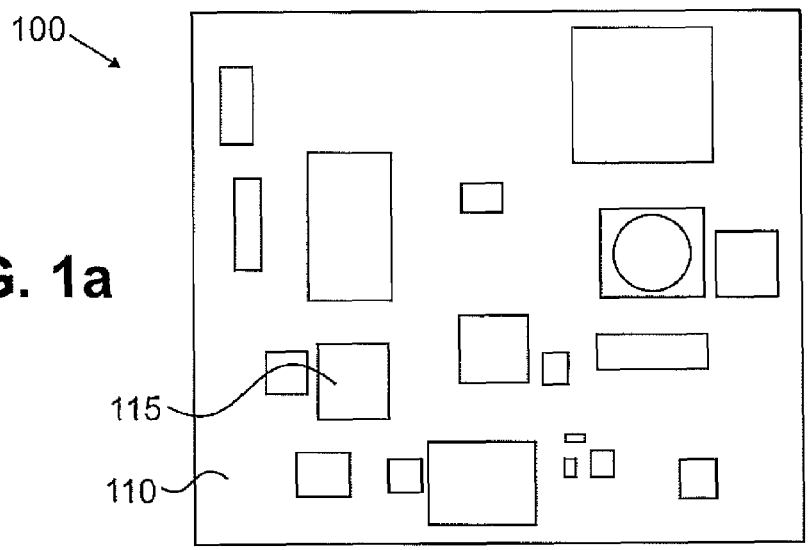
FIGS. 1a and 1b illustrate a circuit board for a wireless handset device according to embodiments of the disclosure.
Figure 1B:
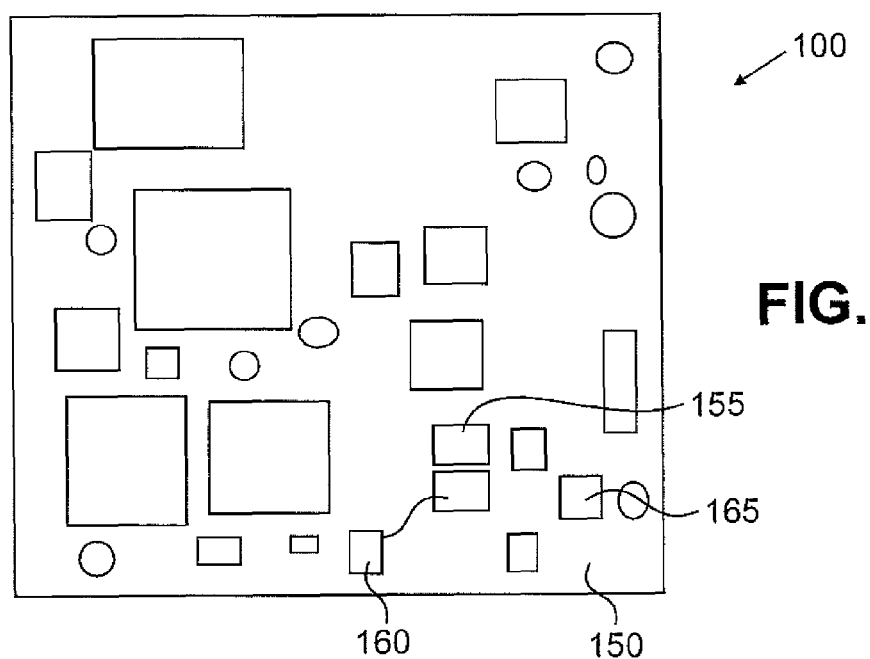

FIGS. 1a and 1b illustrate exemplary block diagrams of a circuit board for a wireless handset device. The wireless handset device (hereinafter "handset", not specifically illustrated) may be required to communicate via a plurality of signal protocols such as a plurality of modes and a plurality of frequencies.

In one example, the handset is a quad-band GSM and tri-band WCDMA handset. The handset includes a circuit board 100. The circuit board 100 has a front side 110 and a back side 150. It will be understood that use of the terms "front side" and "back side" are exemplary and represent no specific orientation with respect to a face of the handset and a back of the handset.

Figure 1C:
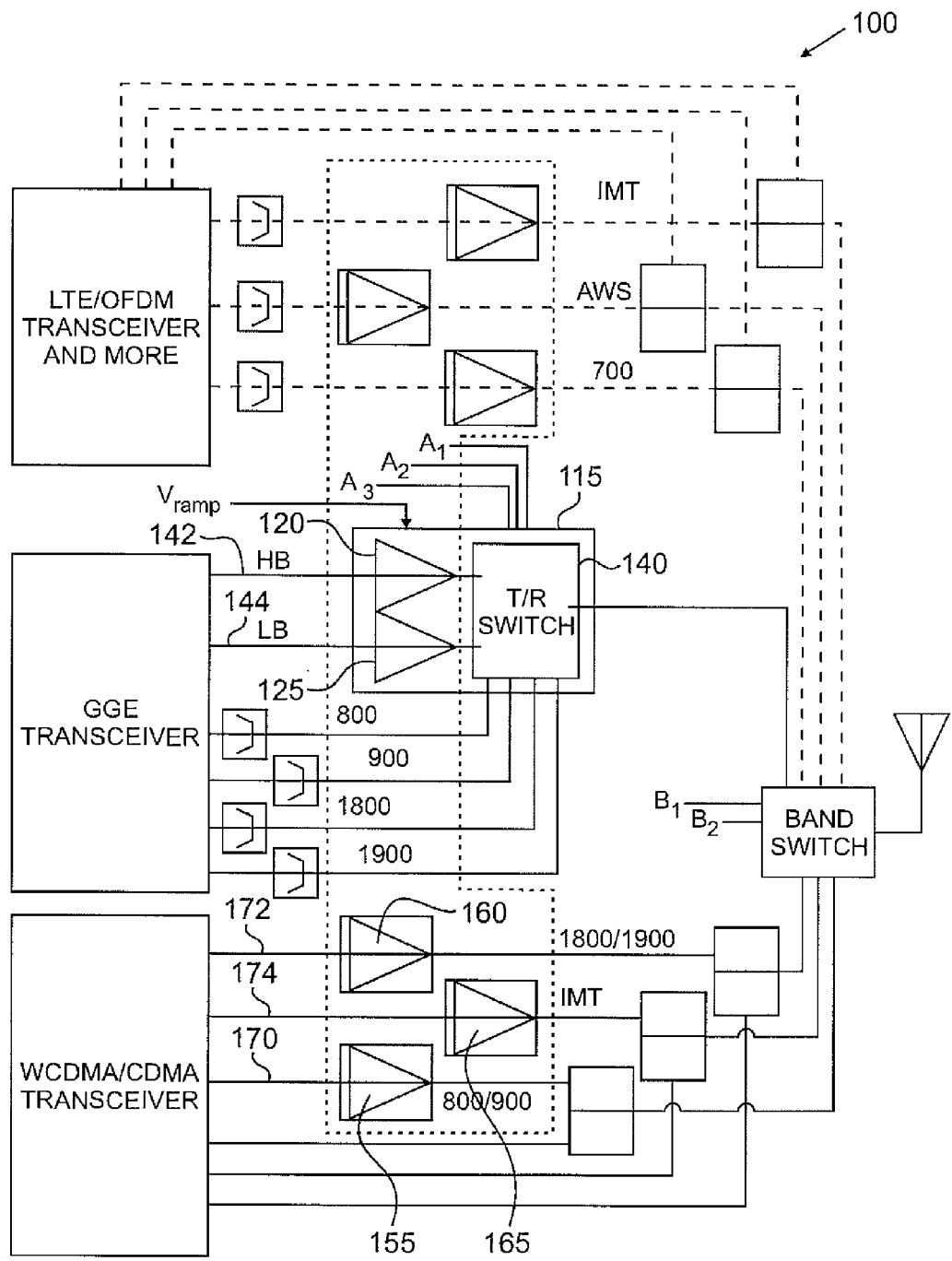
FIG. 1c illustrates a schematic diagram of the circuit board of the wireless handset device according to embodiments of the disclosure.

Referring to FIGS. 1a and 1c, the front side 110 includes one GSM PA module 115. The GSM PA module 115 includes a GSM power amplifier 120 covering Digital Cellular Communications System ("DCS") and Personal Communication Service ("PCS") bands, a GSM power amplifier 125 covering US cellular and European cellular bands, and a transmitter/receiver (hereinafter "T/R") switch 140.

Referring now to FIG. 1b, the back side 150 includes a first WCDMA power amplifier 155 for US cellular band, a second WCDMA power amplifier 160 for PCS band, and a third WCDMA power amplifier 165 for International Mobile Telecommunications-2000 ("IMT-2000") band.

Referring back to FIG. 1c, an exemplary schematic diagram of the circuit boards of the wireless handset device is illustrated. Even though the two GSM band power amplifiers 120 and 125 are packaged into a single power amplifier module 115, these modules contain two separate power amplifier circuits, one for the higher bands 142 and another for the lower bands 144. Additionally, the handset includes a first power amplifier circuit 170 for the first WCDMA PA 155, a second power amplifier circuit 172 for the second WCDMA PA 160 and a third power amplifier circuit 174 for the third WCDMA PA 165. Thus, the handset has five complete discrete PA circuits. Having five complete discrete PA circuits has a significant size and cost impact on the overall handset design.

Figure 2:
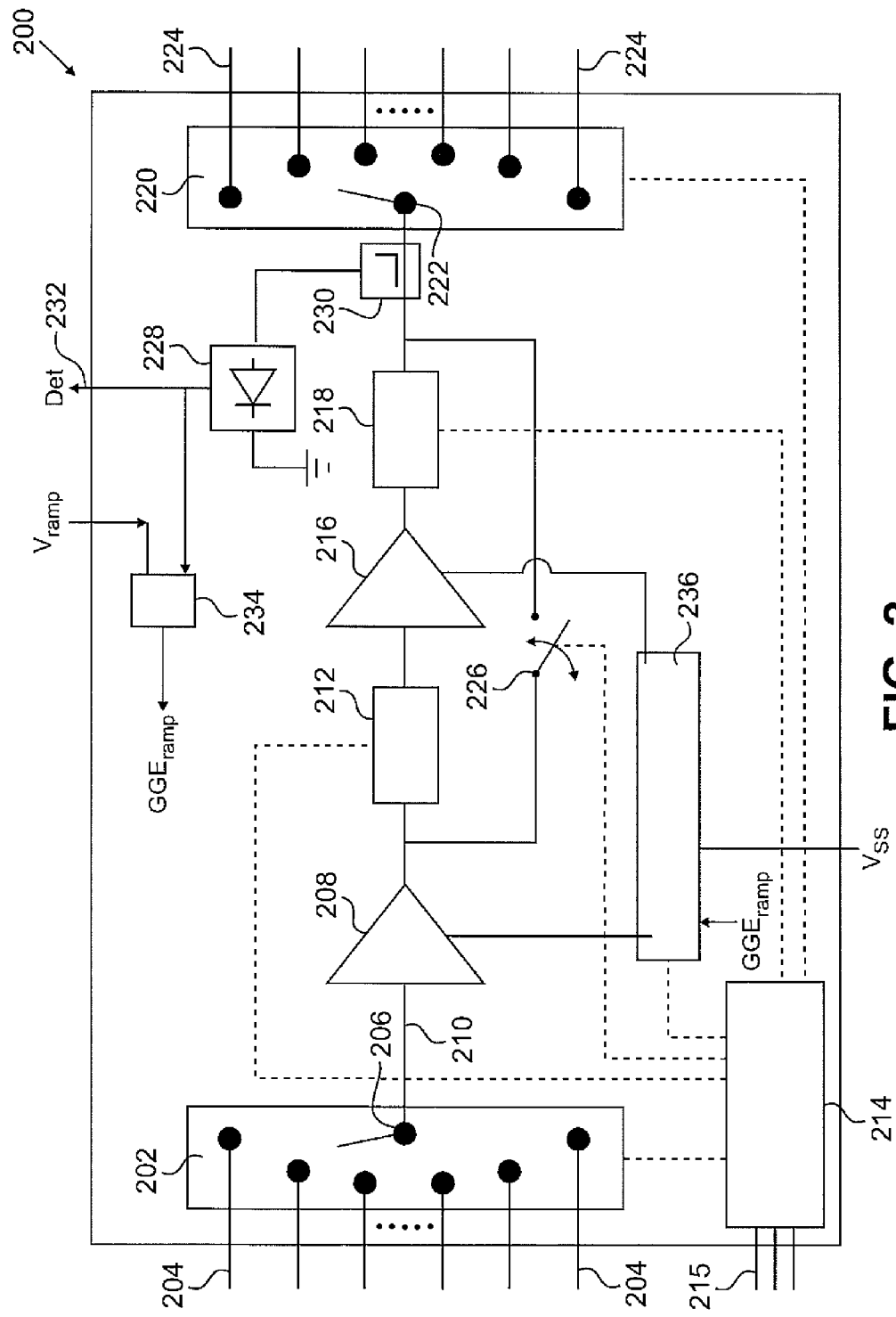
FIGS. 2-4 illustrate a tunable power amplifying module according to exemplary embodiments of the disclosure.

Referring now to FIG. 2, a simple block diagram schematic for a tunable PA module according to one embodiment of the present disclosure is illustrated. The tunable PA module 200 is dimensioned to fit into current handset architecture. The tunable PA module 200 is dimensioned such that the tunable PA module 200 substantially matches the circuit board space requirements of at least one of the dedicated power amplifier for an individual mode or band of operation, e.g., tunable PA module 200 is dimensioned to substantially match the dimensions of at least one of GSM PA module 115 (or GSM PA 120 or GSM PA 125), GSM PA first WCDMA PA 155, second WCDMA PA 160, and a third WCDMA PA 165.

The tunable PA module 200 includes a first interface 202 for receiving an input signal to be amplified. The first interface 202 has a plurality of input terminals 204 and a single pole output terminal 206. In one example, the first interface 202 is a Single Pole Multi Throw switch (hereinafter "SPnT") enabled by Micro-Electro-Mechanical System (hereinafter "MEMS") technology, or semiconductor technology. Therefore, the first interface 202 is configured to couple to a plurality of input signal sources and receive a plurality of signal types. The plurality of input signal sources corresponds to plurality of signal types comprising the multiple modes and multiple frequency bands in which handset is required to operate. As such, the first interface 202 is configured to receive a plurality of signal types associated with the plurality of signal sources via the plurality of input terminals 204.

The single pole output terminal 206 is coupled to an input of a broadband power amplifier 208. The broadband PA 208 is a first stage of power amplification of the input signal along a universal power amplification path 210. The broadband PA 208 provides a low power amplification of the input signal. The broadband PA 208 outputs the low power amplified signal via an output terminal.

A first impedance Tunable Matching Network 212 (hereinafter "TMN") receives the low power amplified signal from the output terminal of the broadband PA 208. The first TMN 212 has an input coupled to the output terminal of the broadband PA 208 and an output. In some embodiment, the first TMN 212 is a digital impedance tunable matching network as developed by Samsung Electronics Co., Ltd. and disclosed in U.S. Pat. No. 7,332,980, titled "SYSTEM AND METHOD FOR A DIGITALLY TUNABLE IMPEDANCE MATCH- ING NETWORK," which is hereby incorporated by reference in its entirety. In one such embodiment, the first TMN 212 is a MEMS device.

The first TMN 212 is configured to adjust an impedance value of the first TMN 212 (e.g., vary the impedance value from a low impedance to a high impedance, a high impedance to a low impedance, or an impedance value there between) based on a configuration signal received from a SPI/I²C/Decoder 214 (discussed in detail herein below). Accordingly, the first TMN 212 is coupled to the SPI/I²C/Decoder 214. Therefore, the first TMN 212 can be tuned (e.g., adjusted) for multiple bands and modes of operation.

A final PA 216 is a second stage of power amplification of the input signal. The final PA 216 is coupled on an input to an output of the first TMN 212. The final PA 216 is a high power amplifier configured to provide a high power amplification of the input signal along the amplifying path 210. Thus, the output of the final PA 216 is a high power amplified signal.

The high power amplified signal is received at an input of a second TMN 218. The second TMN 218 has an input coupled to the output of the final PA 216 and an output. In some embodiments, the second TMN 218 is also a digital impedance tunable matching network as developed by Samsung Electronics Co., Ltd. and disclosed in U.S. Pat. No. 7,332,980, titled "SYSTEM AND METHOD FOR A DIGITALLY TUNABLE IMPEDANCE MATCHING NETWORK." In one such embodiment, the second TMN 218 is a MEMS device.

The second TMN 218 is configured to adjust an impedance value of the second TMN 218 (e.g., vary the impedance value from a low impedance to a high impedance, a high impedance to a low impedance, or an impedance value there between) based on a configuration signal received from the SPI/I²C/Decoder 214 (discussed in detail herein below). Accordingly, the second TMN 218 is coupled to the SPI/I²C/Decoder 214. Therefore, the second TMN 218 can be tuned (e.g., adjusted) for various bands and modes of operation.

The output of the second TMN 218 is coupled to a second interface 220. The second interface 202 has a single pole input terminal 222 and a plurality of output terminals 224. In one example, the second interface 220 is a SPnT enabled by MEMS technology. Therefore, the second interface 220 is configured to couple to a plurality of signal transmission paths and output a plurality of signal types. The plurality of signal transmission paths corresponds to the multiple modes and multiple frequency bands in which handset is required to operate. As such, the second interface 220 is configured to output a plurality of signal types associated with the plurality of signal sources via the plurality of output terminals 224.

The tunable PA module 200 includes the amplifying path 210. The amplifying path 210 includes the broadband PA 208, the first TMN 212, the final PA 216 and the second TMN 218. In some embodiments, the amplifying path 210 includes a bypass switch 226. The bypass switch 226 is adapted to change the amplification of the input signal by re-routing the amplifying path 210. The bypass switch 226 is enabled by MEMS technology (not specifically illustrated), or semiconductor technology, to conduct a bypass operation. The bypass switch 226 is configured to re-route the amplifying path 210 in response to a bypass signal received from the SPI/I²C/Decoder 214. In one such embodiment, the bypass switch 226 is coupled on a first terminal to the output of the broadband PA 208 and on a second terminal to the output of the second TMN 218. Therefore, when the bypass switch 226 is closed, the first TMN 212, the final PA 216 and the second TMN 218 are bypassed. The input signal is amplified by the broadband PA 208 only and the output impedance of the circuit is fixed. In such embodiment, the tunable PA module 200 is configured to provide a low power (e.g., CDMA/WCDMA) signal.

Figure 3:
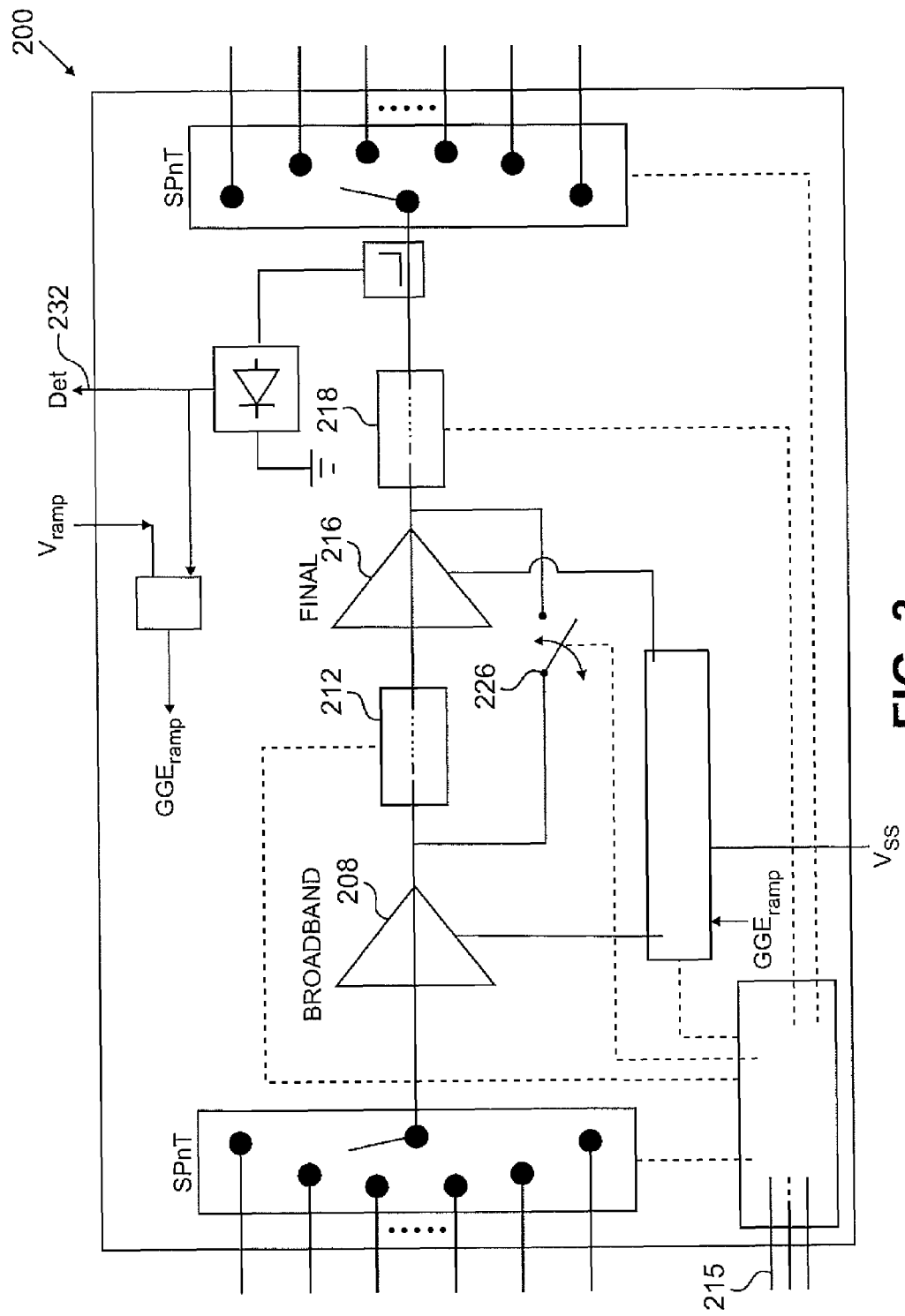

In another embodiment, illustrated in FIG. 3, the bypass switch 226 is coupled on a first terminal to the output of the broadband PA 208 and on a second terminal to the output of the final PA 216. Therefore, when the bypass switch 226 is closed, the first TMN 212 and the final PA 216 are bypassed. The input signal is amplified by the broadband PA 208 and the output impedance of the circuit is tuned with the second TMN 218. However, the input signal is not amplified by the final PA 216 and the circuit impedance is not tuned by the first TMN 212. In such embodiment, the tunable PA module 200 is configured to provide a tunable low power (e.g., CDMA/WCDMA) signal.

Figure 4:
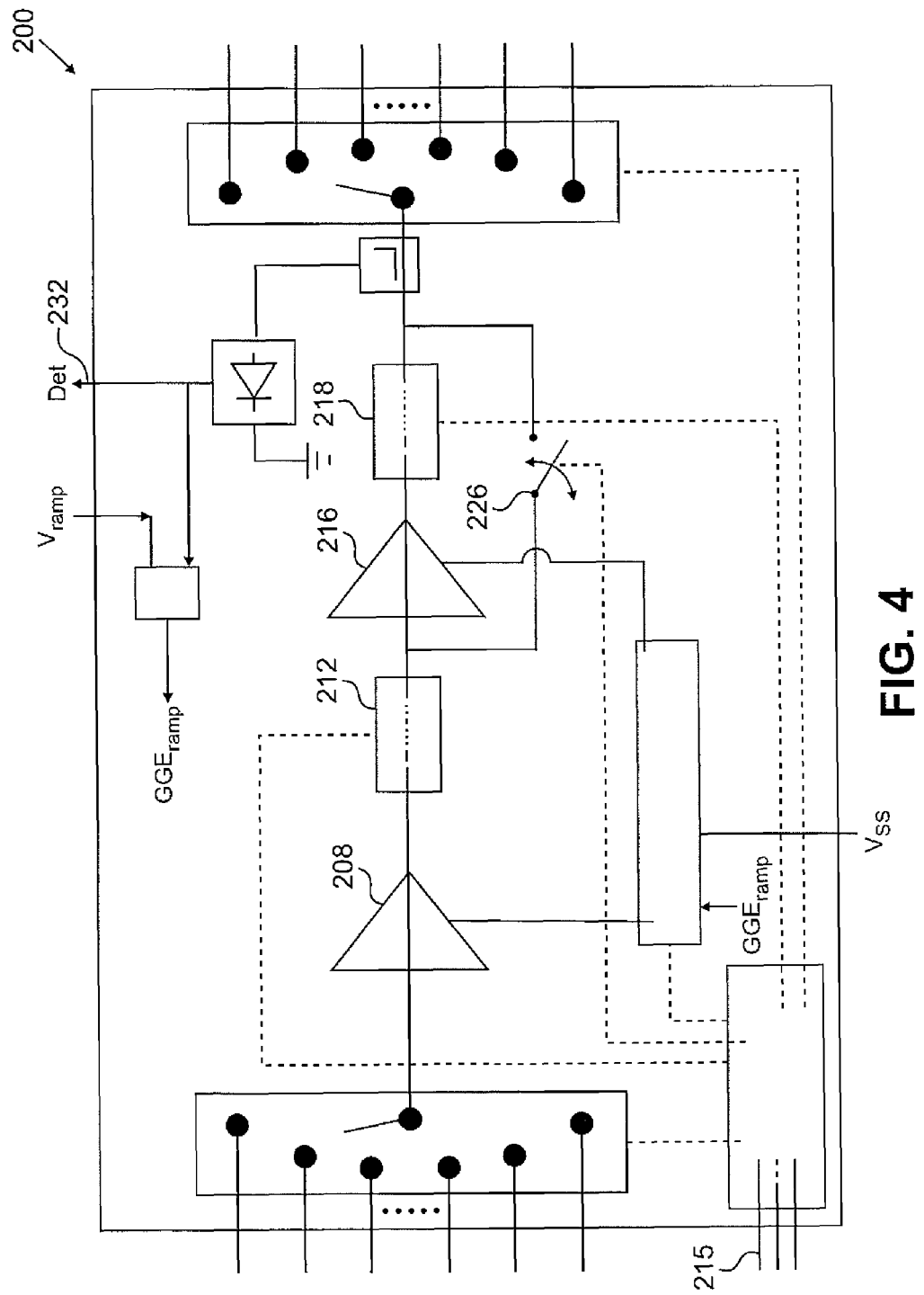

In another embodiment, illustrated in FIG. 4, the bypass switch 226 is coupled on a first terminal to the output of the first TMN 212 and on a second terminal to the output of the second TMN 218. Therefore, when the bypass switch 226 is closed, the final PA 216 and the second TMN 218 are bypassed. The input signal is amplified by the broadband PA 208 and the output impedance of the circuit is tuned with the first TMN 212. However, the input signal is not amplified by the final PA 216 and the circuit impedance is not tuned by the second TMN 218. In such embodiment, the tunable PA module 200 is configured to provide a tunable low power (e.g., CDMA/WCDMA) signal.

In the preceding embodiments, when the bypass switch 226 is in an "open" position (e.g., no bypass operation is conducted), the input signal is processed by each of the broadband PA 208, the first TMN 212, the final PA 216 and the second TMN 218. Thus, the input signal is amplified by the broadband TMN 208 and the final PA 216 and the output impedance of the circuit is tuned by the first TMN 212 and the second TMN 218.

Referring back to FIG. 2, the tunable PA module 200 includes a detector circuit 228. The detector circuit 228 is coupled to the amplifying path 210 at a sensor 230. The detector circuit 228 further is coupled to a GSM power control ramp 234. The detector circuit 228 is configured to detect (e.g., sense) parameters associated with the amplified signal, such as, but not limited to, frequency, bias, power level, noise figure, gain and linearity. The detector circuit 228 provides a real-time feedback of the output of the tunable PA module 200. The detector circuit 228 provides the real time feedback to a processor (not shown) via a detector interface 232.

The processor can be any processor as is known in the art or the processor can be multiple processors. The processor includes is coupled to a memory (e.g., a storage means) for storing a plurality of instructions and algorithms. The storage means can be any computer readable medium, for example, the storage means can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. The processor receives, via the detector interface 232, the real time feedback. In response to receiving the real time feedback, the processor is configured to execute a plurality of instructions and a plurality of algorithms to optimize the performance of the tunable PA module 200. The processor outputs a plurality of control signals, including a configuration signal for the first and second TMNs 212 and 218, a bias and control signal for the broadband PA 208 and final PA 216, and a bypass signal for the bypass switch 226.

The tunable PA module 200 includes the SPI/I²C/Decoder 214. The SPI/I²C/Decoder 214 is coupled to the processor and adapted to receive the plurality of control signals from the processor via SPI interface 215. Additionally, the SPI/I$^2$C/Decoder 214 is coupled to each of the first interface 202, second interface 220, first TMN 212, second TMN 218, bypass switch 226 and a PA Controller 236. The SPI/I$^2$C/Decoder 214 is configured to decode each of the plurality of control signals and transmit a respective configuration signal to each of the first interface 202, first TMN 212, second TMN 218, second interface 220, bypass switch 226 and PA controller 236.

The PA controller 236 comprises transistor bias control circuitry. The PA controller 236 is configured to provide Bias and Control information the broadband PA 208 and the final PA 216. The PA controller 236 is coupled to each of the broadband PA 208 and the final PA 216. Each of the broadband PA 208 and the final PA 216 are configured to adjust settings, such as, but not limited to Bias and Gain, in response to the bias and control information received from the PA controller 236.

Figure 5A:
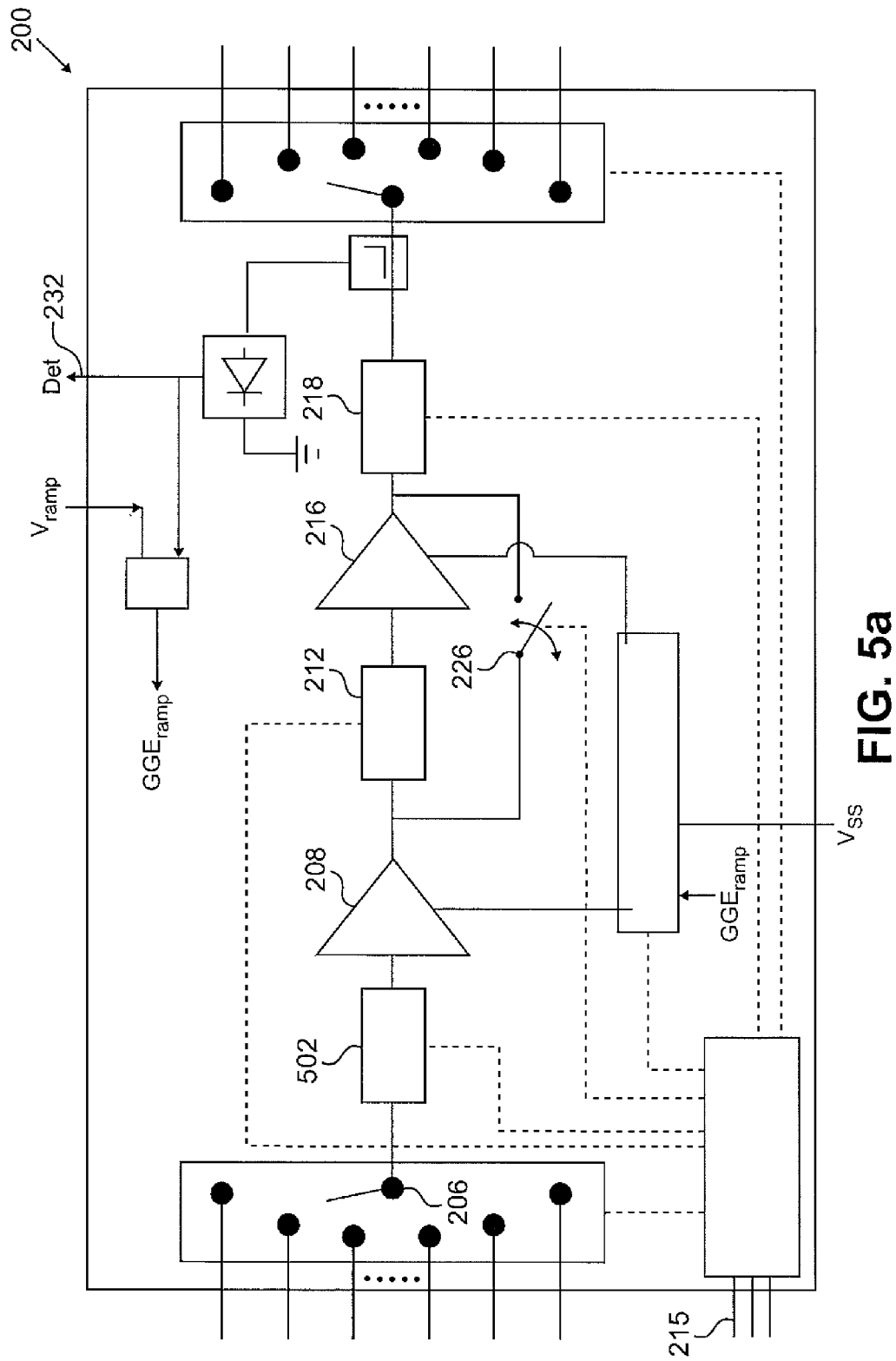
FIGS. 5a-5b illustrate a tunable power amplifying module with three matching networks according to exemplary embodiments of the disclosure.

In another embodiment, illustrated in FIG. 5a, a tunable PA module 200 includes a third TMN 502. The third TMN 502 has an input coupled to the single pole output terminal 206. An output of the third TMN 502 is coupled to the input of the broadband PA 208. In some embodiments, the third TMN 502 is also a digital impedance tunable matching network as developed by Samsung Electronics Co., Ltd. and disclosed in U.S. Pat. No. 7,332,980, titled "SYSTEM AND METHOD FOR A DIGITALLY TUNABLE IMPEDANCE MATCHING NETWORK." In one such embodiment, the third TMN 502 is a MEMS device.

The third TMN 502 is configured to adjust an impedance value of the third TMN 502 (e.g., vary the impedance value from a low impedance to a high impedance, a high impedance to a low impedance, or an impedance value there between) based on a configuration signal received from the SPI/I$^2$C/Decoder 214. Accordingly, the third TMN 502 is also coupled to the SPI/I$^2$C/Decoder 214. Therefore, the third TMN 502 can be tuned (e.g., adjusted) for multiple bands and modes of operation. In such embodiment, the processor can utilize the tunable impedances of each of the TMNs 212, 218 and 502 to tune the impedance of the amplifying path 210.

The tunable PA module 200 includes a bypass switch 226. As described with respect to FIGS. 2, 3 and 4, the bypass switch 226 is adapted to change the amplification of the input signal by re-routing the amplifying path 210. The bypass switch 226 is enabled by MEMS technology (not specifically illustrated) to conduct a bypass operation. The bypass switch 226 is configured to re-route the amplifying path 210 in response to a bypass signal received from the SPI/I$^2$C/Decoder 214. In one such embodiment, the bypass switch 226 is coupled on a first terminal to the output of the broadband PA 208 and on a second terminal to the output of the final PA 216. Therefore, when the bypass switch 226 is closed, the first TMN 212 and the final PA 216 are bypassed. The input signal is amplified by the broadband PA 208 only and the impedance of the circuit is varied by the second TMN 218 and the third TMN 502. In such embodiment, the tunable PA module 200 is configured to provide a low power (e.g., CDMA/WCDMA) signal.

Figure 5B:
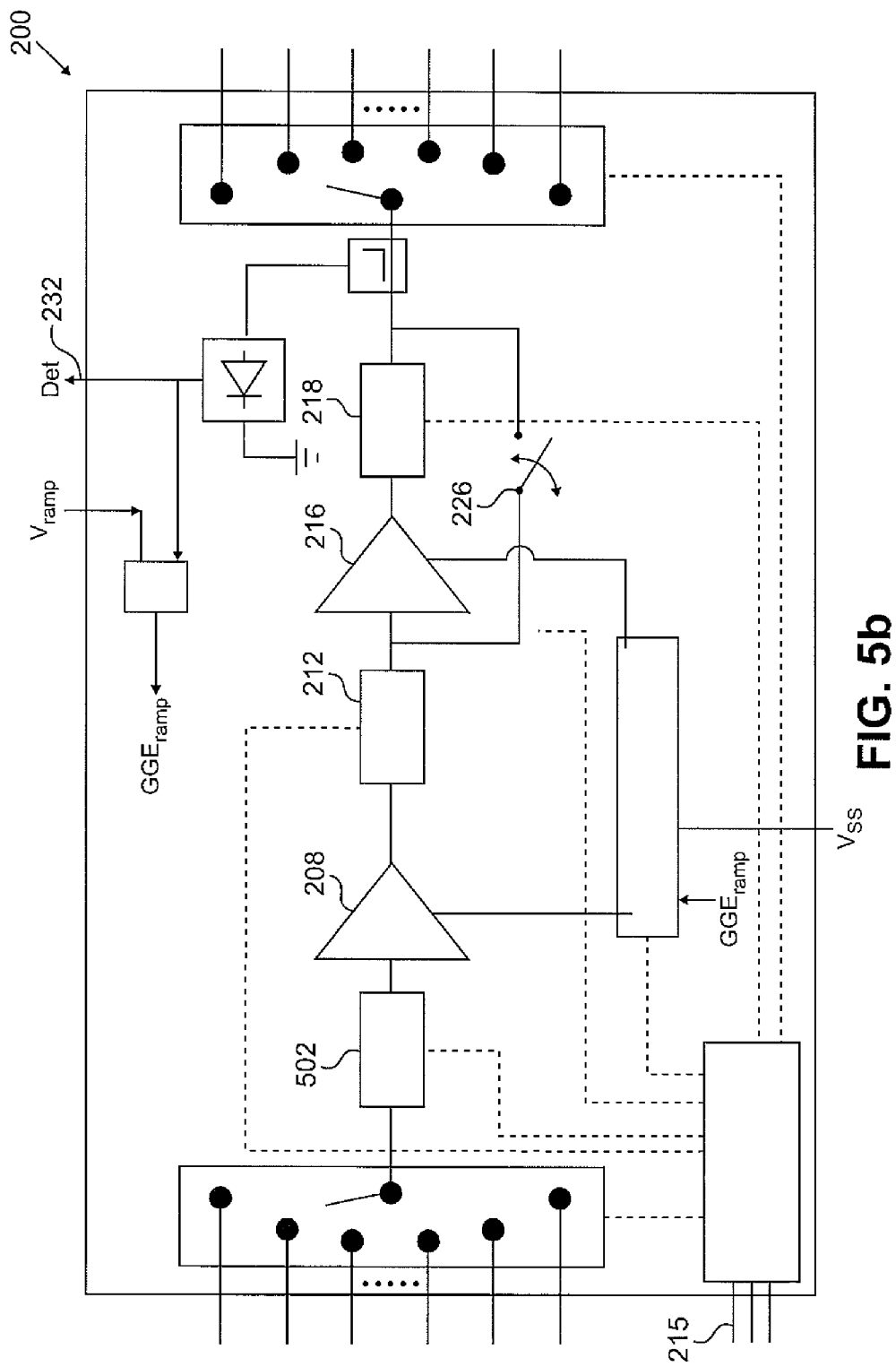

FIG. 5b illustrates another embodiment in which the tunable PA module 200 includes a third TMN 502. In such embodiment, the bypass switch 226 is coupled on a first terminal to the output of the first TMN 212 and on a second terminal to the output of the second TMN 218. In such embodiment, when the bypass switch 226 is closed, the input signal is amplified by the broadband PA 208 only and the impedance of the circuit is varied by the first TMN 212 and the third TMN 502.

It will be understood that the illustration of the terminal couplings of the bypass switch 226 in FIGS. 5a and 5b is merely exemplary and multiple connection configurations can be accomplished without departing from the scope of this disclosure.

Figure 6A:
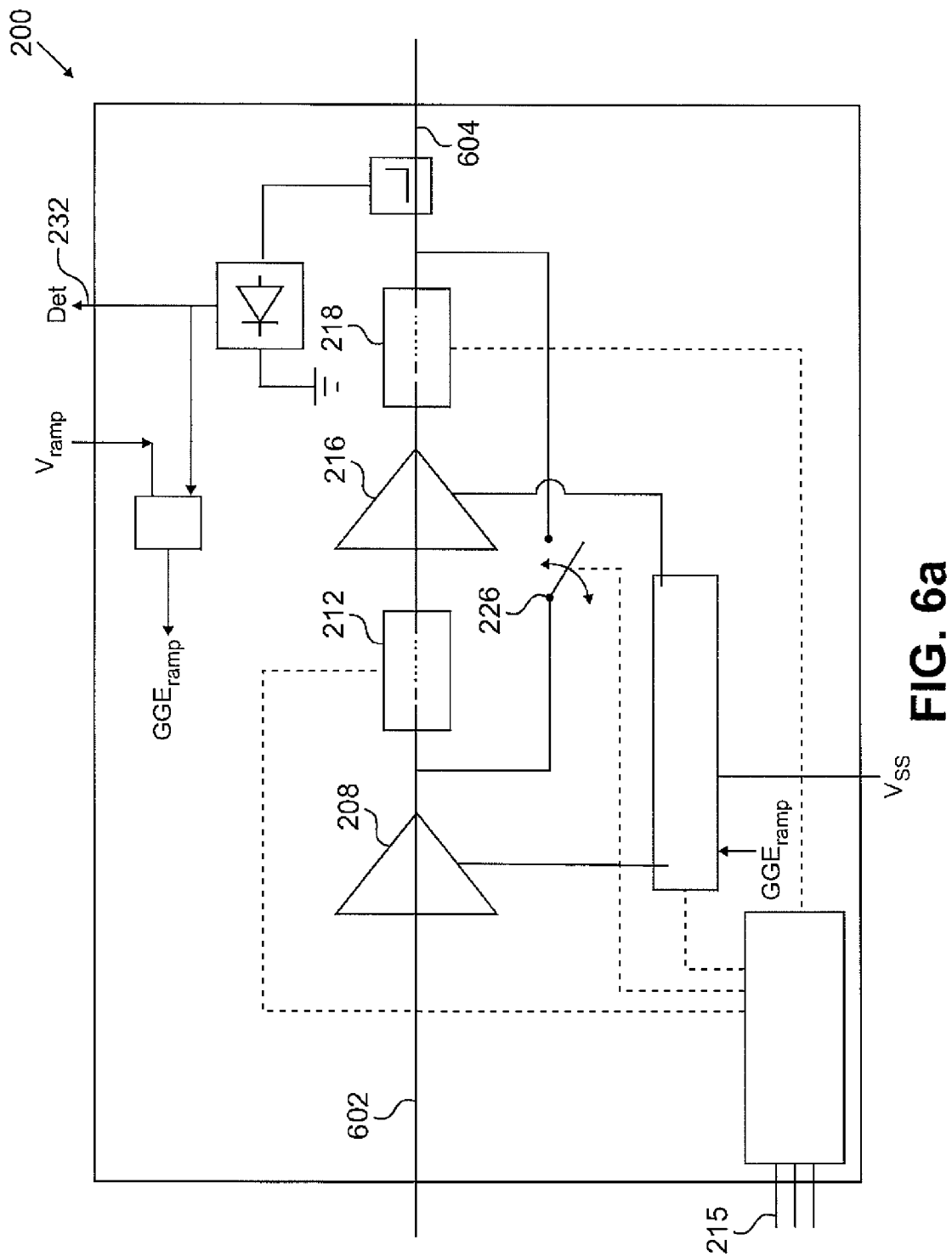
FIGS. 6a-6k illustrate block configurations of a tunable power amplifying module according to exemplary embodiments of the disclosure.
Figure 6B:
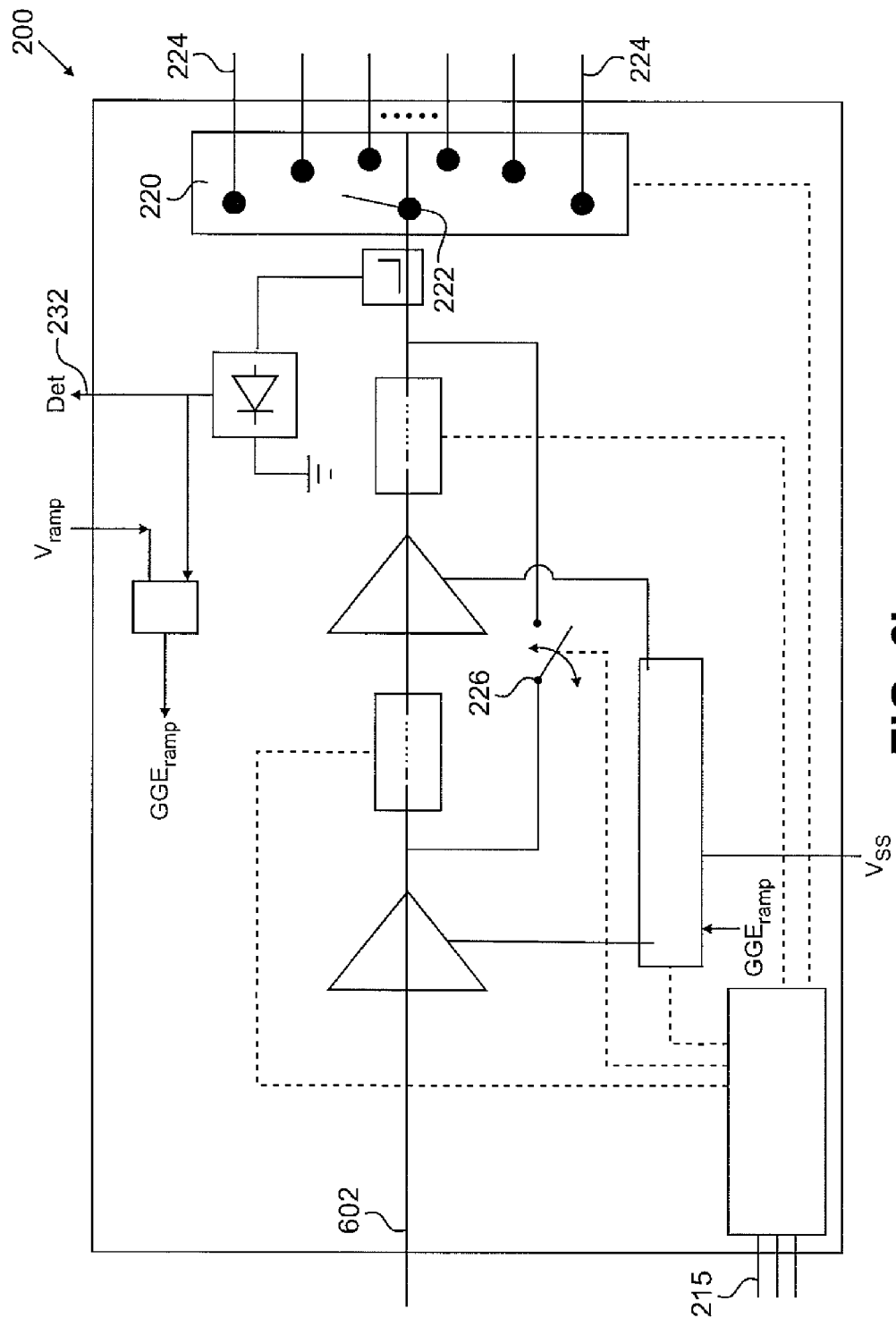
Figure 6C:
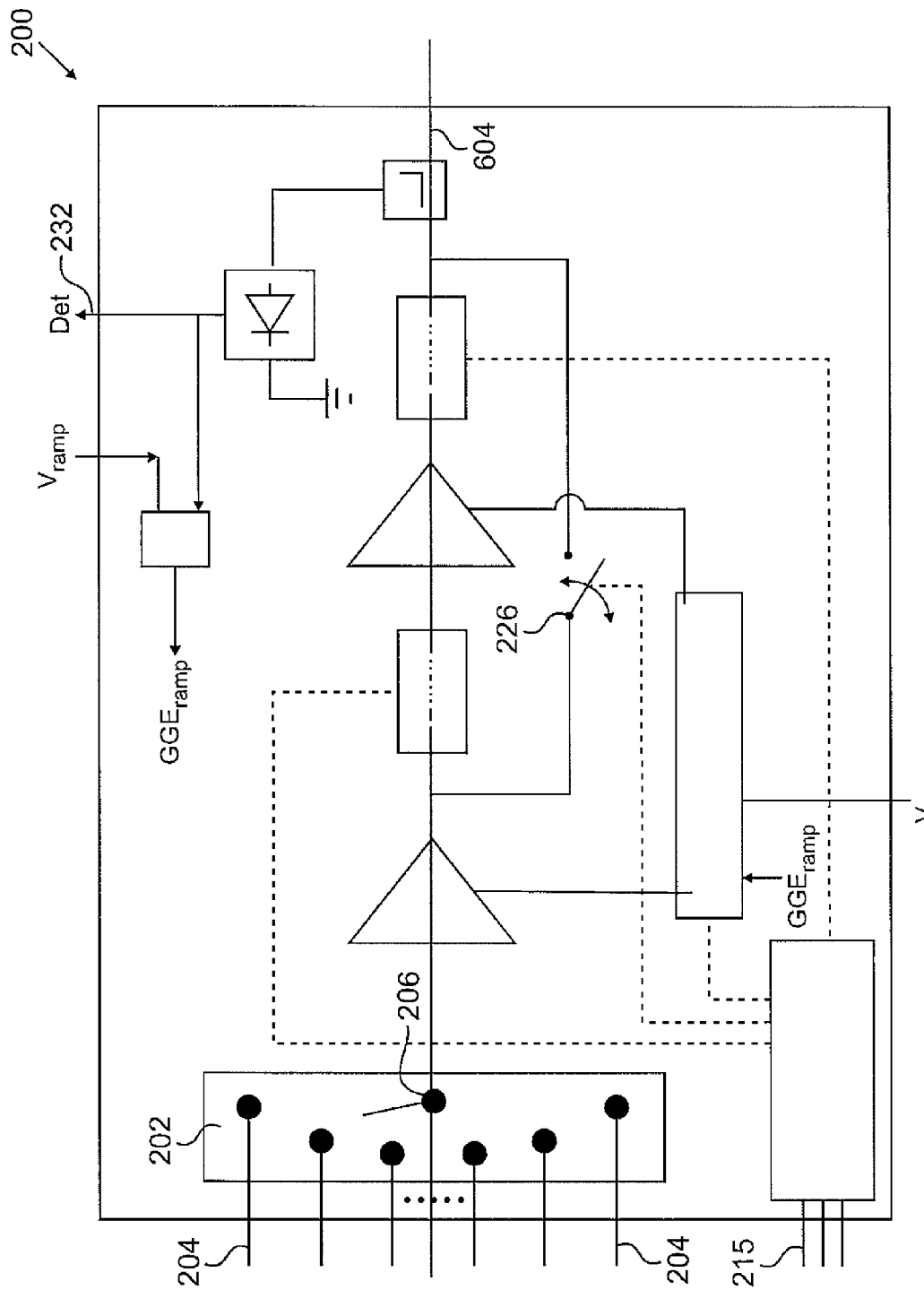

Referring now to FIGS. 6a, 6b and 6c, the tunable PA module 200 may include at least one single terminal interface for the signal. In one embodiment, the first interface 602 is a single pole terminal configured to receive an input signal to be amplified. The input signal may be selected from a plurality of signal sources or may be a universal signal applicable to multiple modes and multiple bands. The second interface 604 is also a single pole terminal configured to output an amplified version of the signal from the tunable PA module 200. In such embodiment, the tunable PA module 200 is configured to receive an input signal via a single terminal connection and output an amplified signal via a single terminal connection. Accordingly, a circuit board including the tunable PA module 200 is designed to require only one input terminal and one receive terminal for all modes and all bands as opposed to one input terminal and one receive terminal for each respective mode and band for which the handset is required to operate.

FIG. 6b illustrates another embodiment of the tunable PA module 200. In such embodiment, the first interface 602 is a single pole terminal configured to receive an input signal to be amplified. The input signal may be selected from a plurality of signal sources or may be a universal signal applicable to multiple modes and multiple bands. The second interface 222 is a SPnT (as described herein above with respect to FIG. 2).

FIG. 6c illustrates yet another embodiment of the tunable PA module 200. In such embodiment, the first interface 202 is a SPnT (as discussed herein above with respect to FIG. 2) and the second interface 604 is a single pole terminal configured to output an amplified version of the signal from the tunable PA module 200. In such embodiment, the tunable PA module 200 is configured to receive an input signal via at least one of a plurality of input terminals 204 and output an amplified signal via a single terminal connection.

Figure 6D:
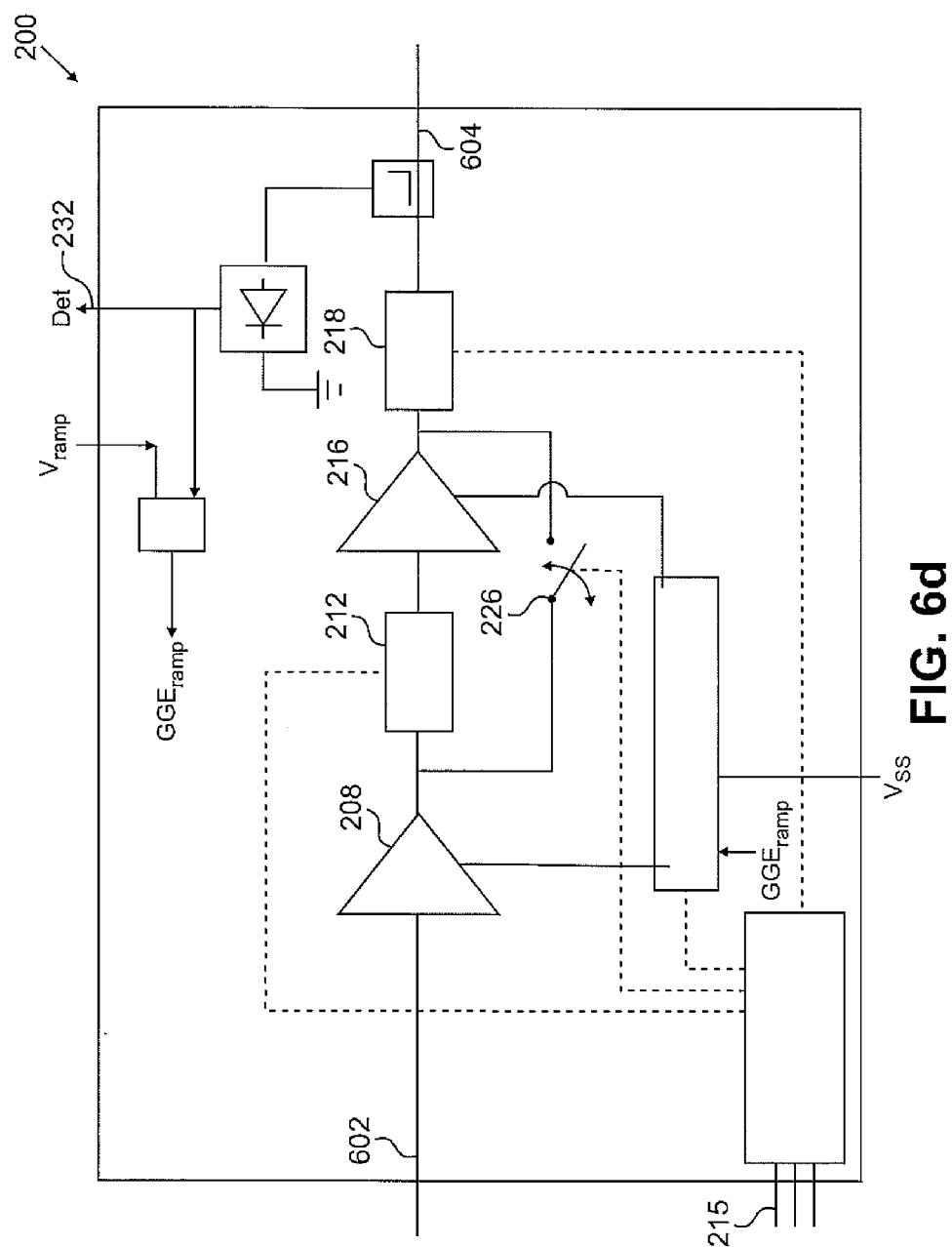
Figure 6E:
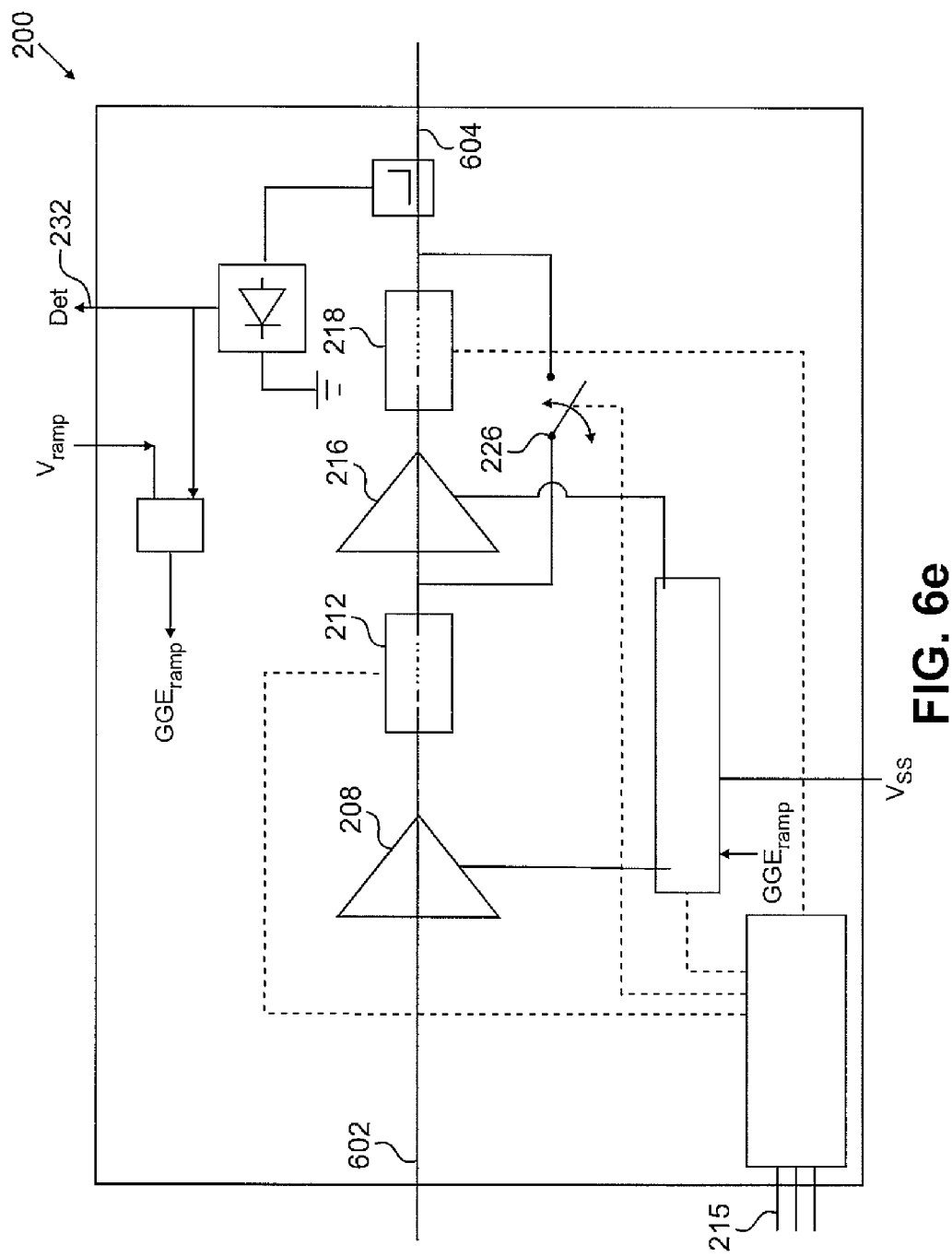
Figure 6F:
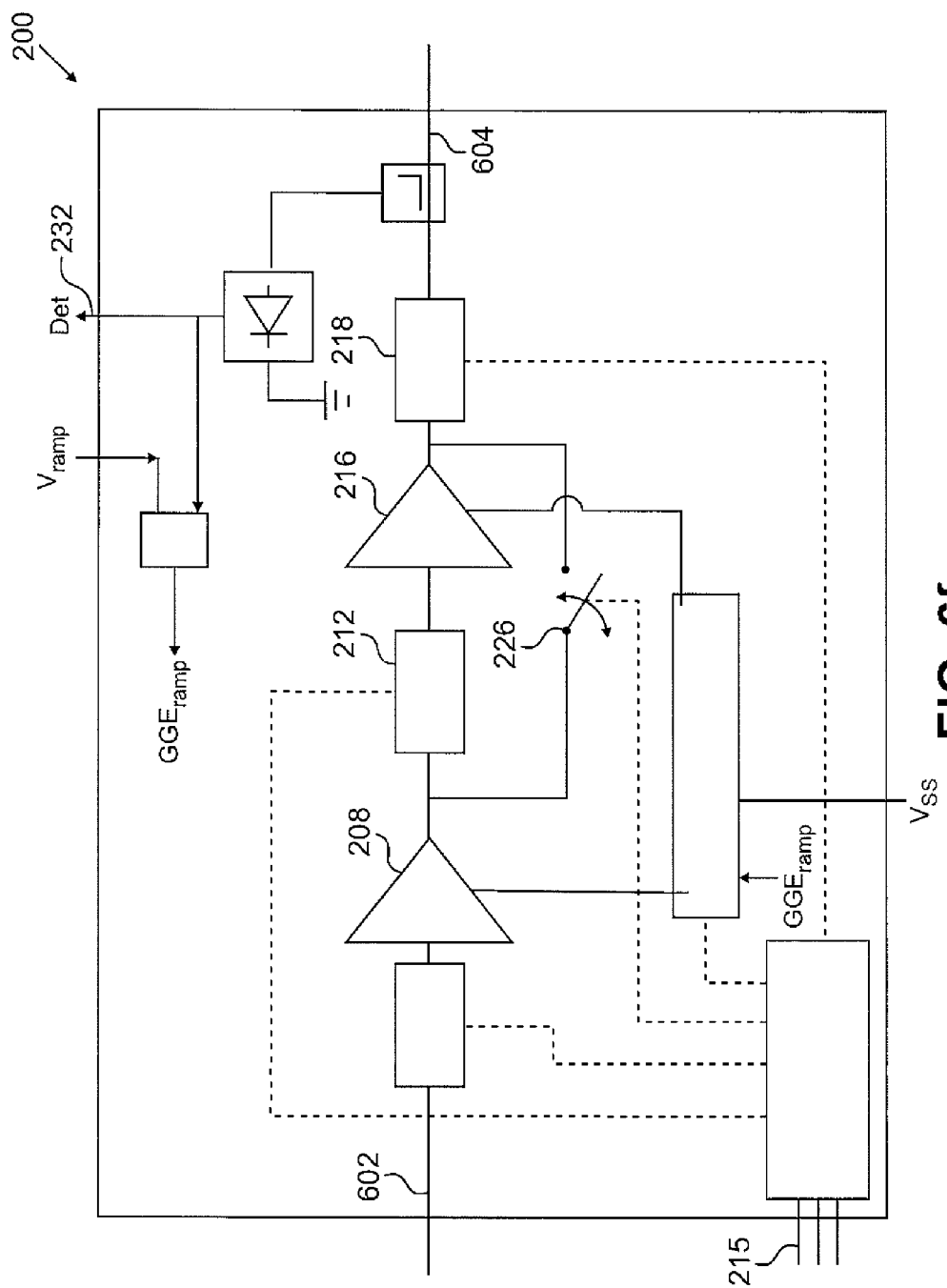
Figure 6G:
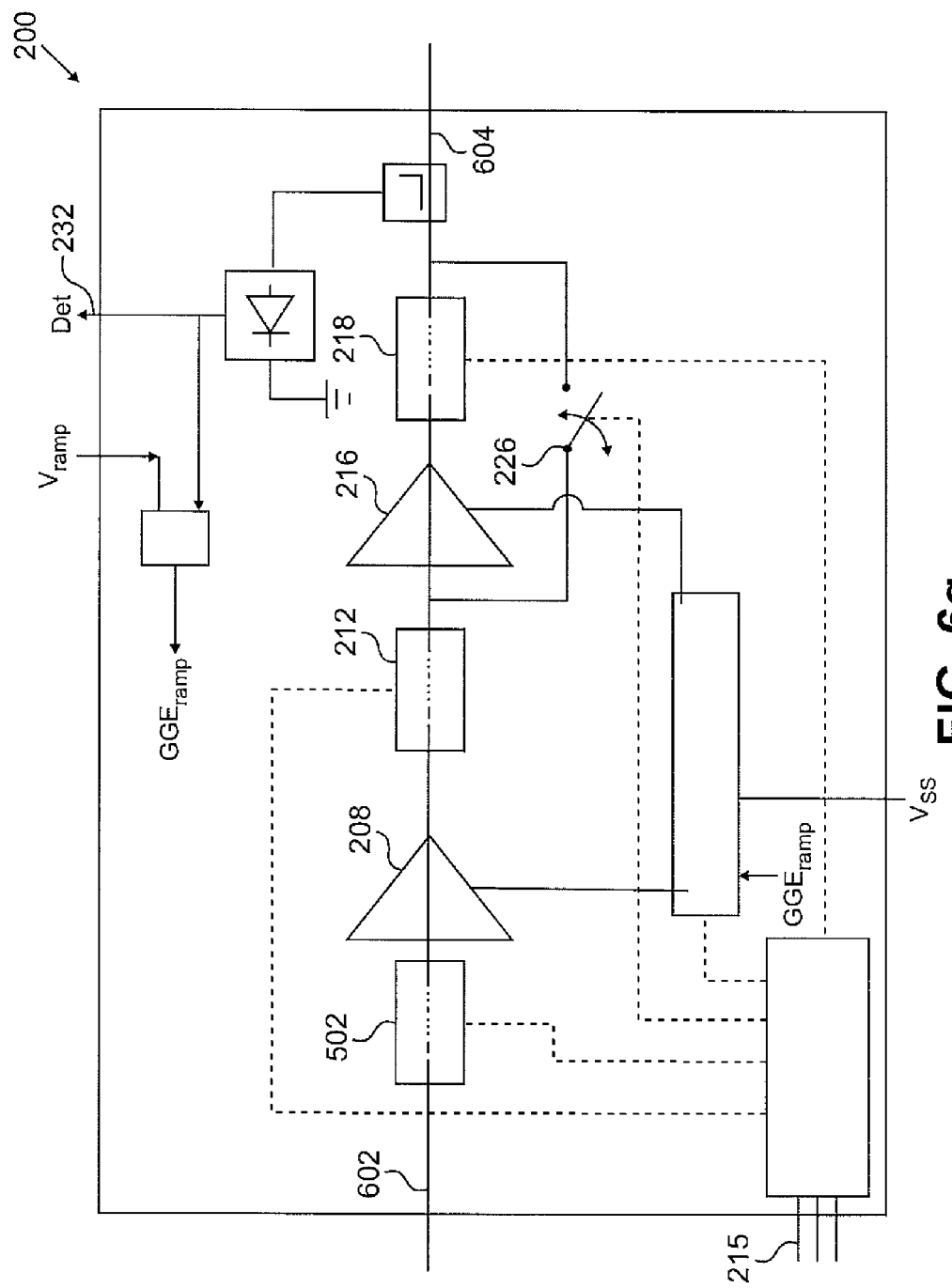
Figure 6H:
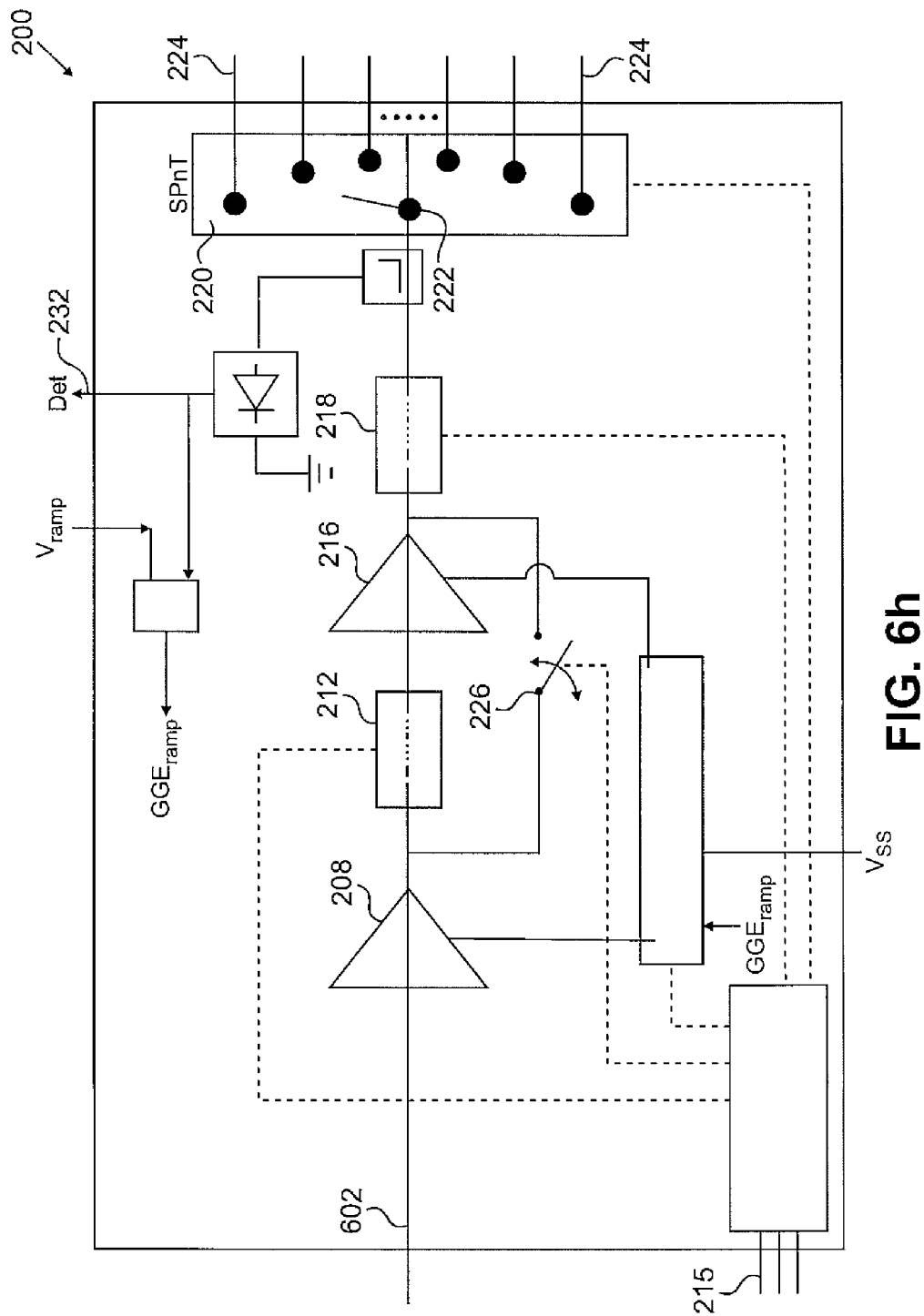
Figure 6I:
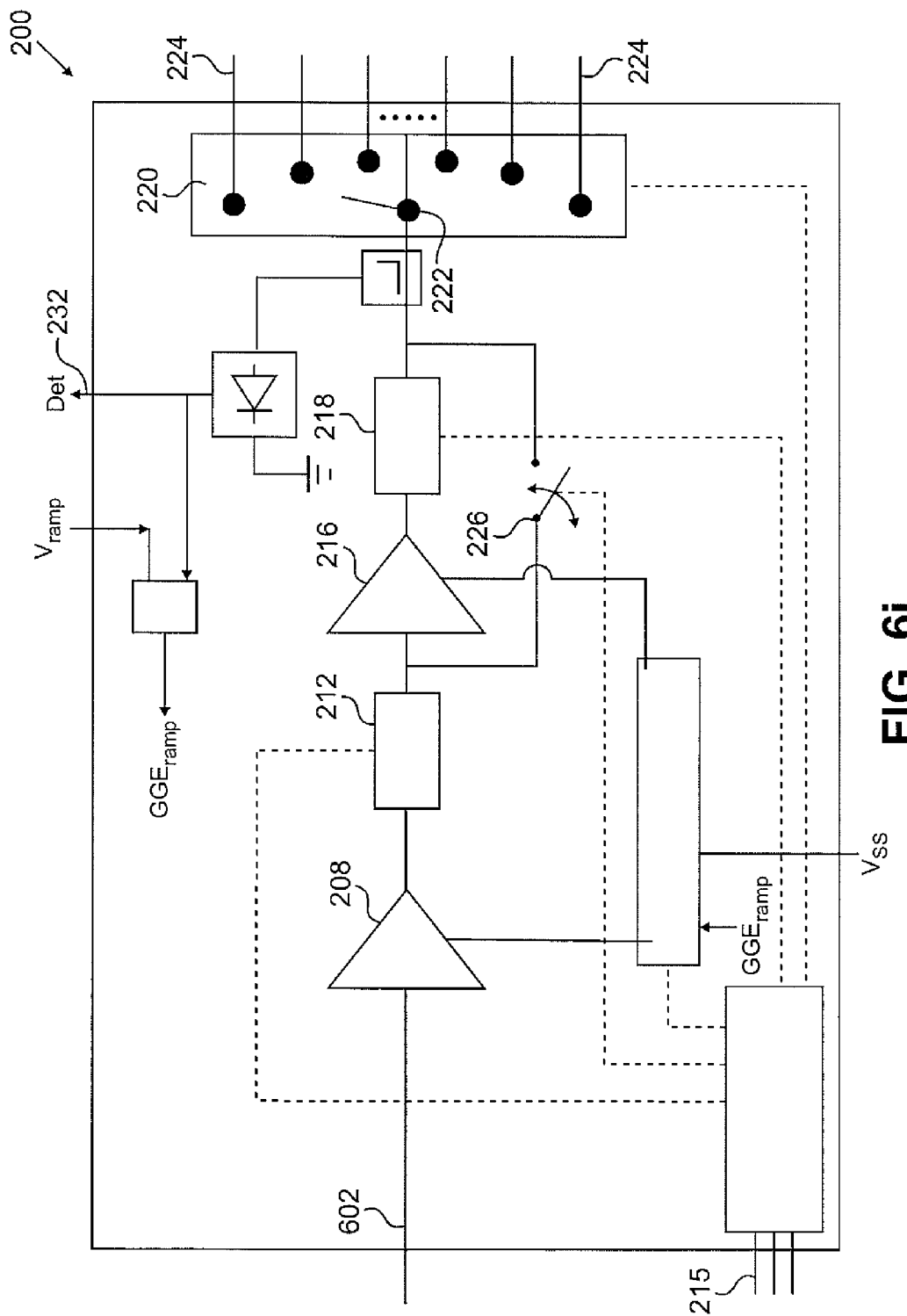
Figure 6J:
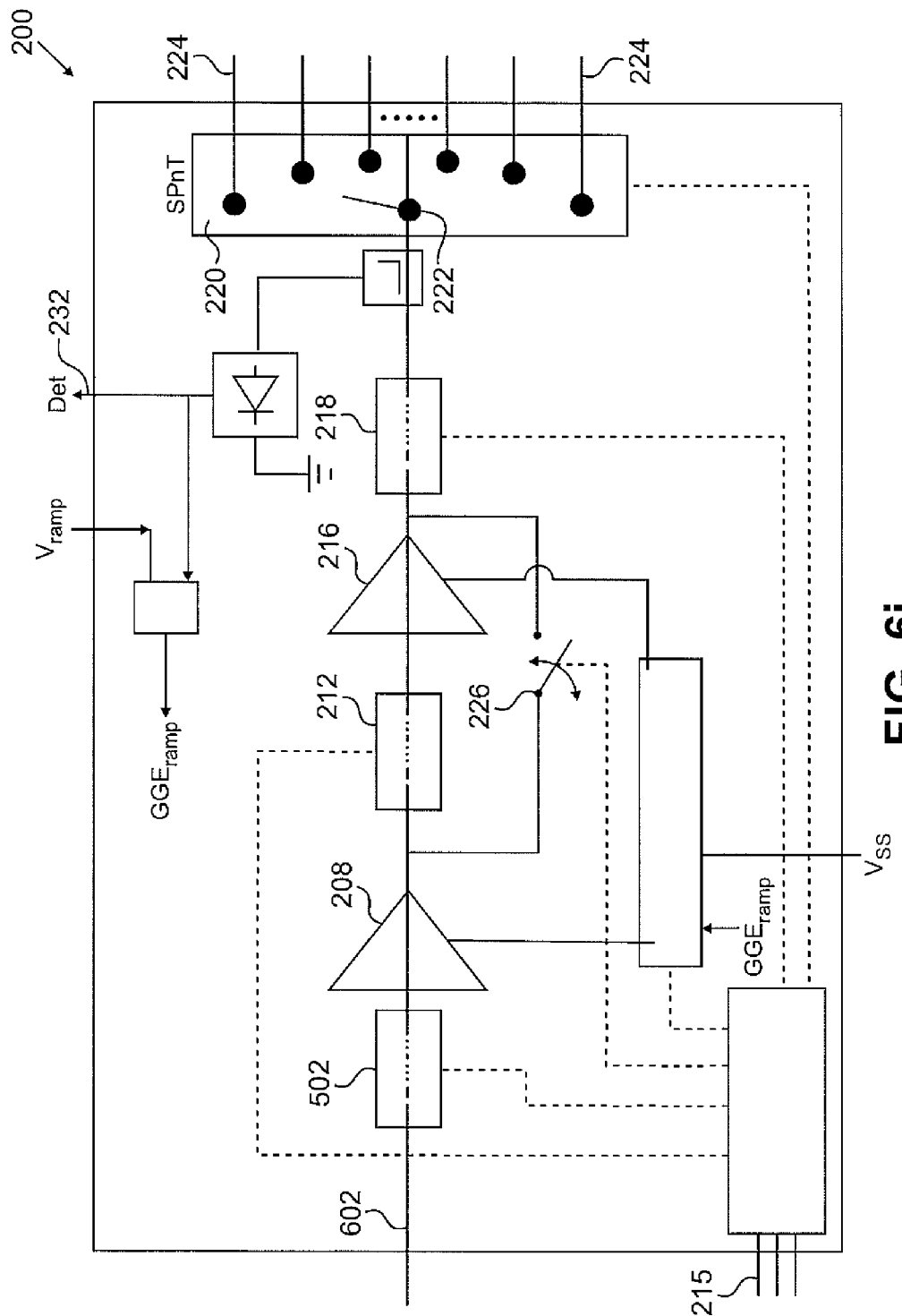
Figure 6K:
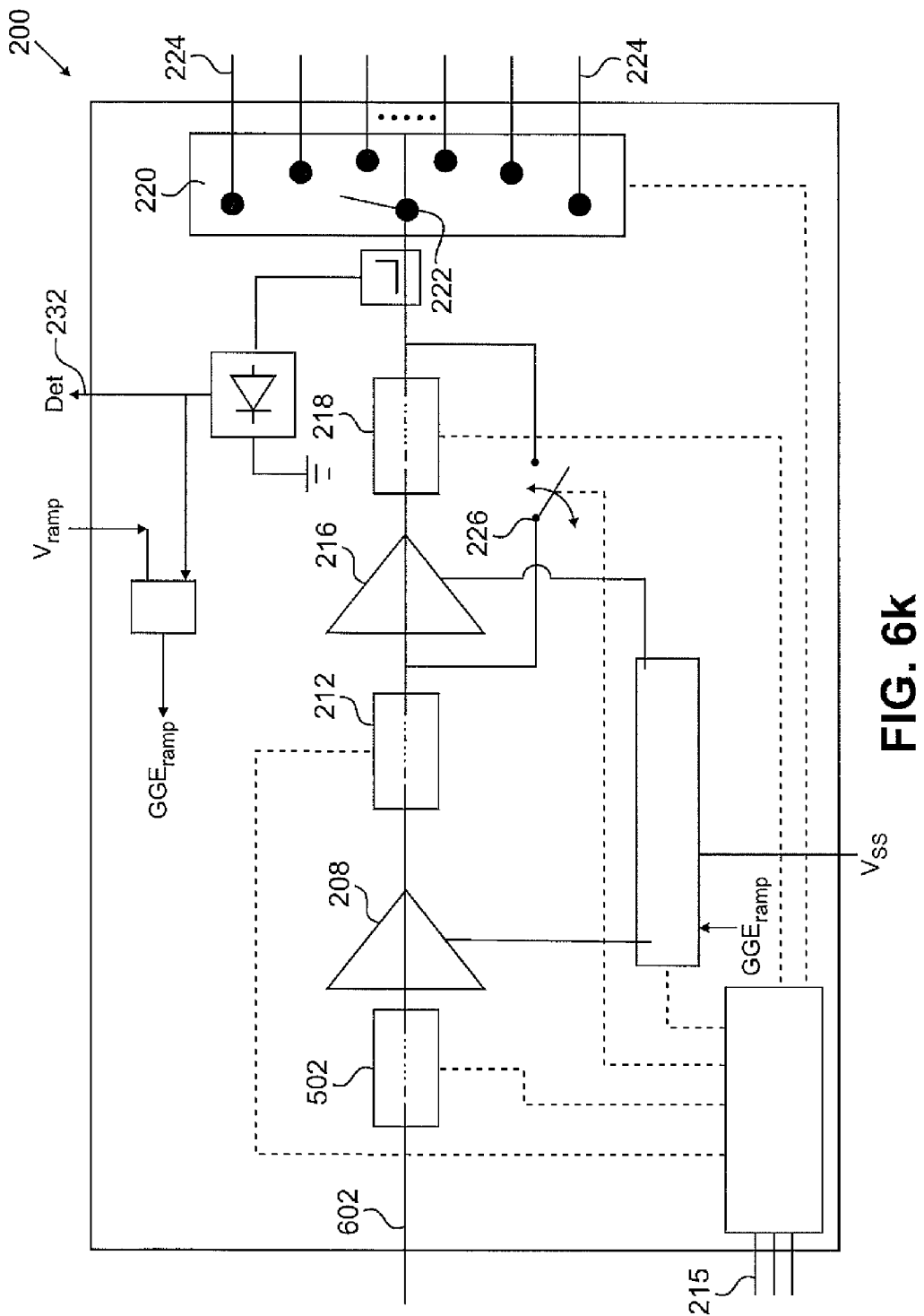

FIGS. 6d-6k illustrate various configurations for the tunable PA module 200. For example, FIG. 6d illustrates a configuration wherein the first interface 602 and the second interface 604 are each single pole terminals and the bypass switch 226 is coupled in a configuration in order to bypass the first TMN 212 and the final PA 216. FIG. 6e illustrates a configuration wherein the first interface 602 and the second interface 604 are each single pole terminals and the bypass switch 226 is coupled in a configuration in order to bypass the second TMN 218 and the final PA 216. FIG. 6f illustrates a configuration including the third TMN 502 and wherein the first interface 602 and the second interface 604 are each single pole terminals and the bypass switch 226 is coupled in a configuration in order to bypass the first TMN 212 and the final PA 216. FIG. 6g illustrates a configuration including the third TMN 502 and wherein the first interface 602 and the second interface 604 are each single pole terminals and the bypass switch 226 is coupled in a configuration in order to bypass the second TMN 218 and the final PA 216. FIG. 6h illustrates a configuration wherein the first interface 602 is a single pole terminal, the second interface 220 is a SPnT terminal and the bypass switch 226 is coupled in a configuration in order to bypass the first TMN 212 and the final PA 216. FIG. 6i illustrates a configuration wherein the first interface 602 is a single pole terminal, the second interface 220 is a SPnT terminal and the bypass switch 226 is coupled in a configuration in order to bypass the second TMN 218 and the final PA 216. FIG. 6*j* illustrates a configuration including the third TMN 502, wherein the first interface 602 is a single pole terminal, the second interface 220 is a SPnT terminal and the bypass switch 226 is coupled in a configuration in order to bypass the first TMN 212 and the final PA 216. FIG. 6*k* illustrates a configuration including the third TMN 502, wherein the first interface 602 is a single pole terminal, the second interface 220 is a SPnT terminal and the bypass switch 226 is coupled in a configuration in order to bypass the second TMN 218 and the final PA 216.

It will be understood that the configurations of the tunable PA module are not limited to those illustrations in FIGS. 6*a* through 6*k*. The illustrations in FIGS. 6*a* through 6*k* are merely exemplary and many other configurations can be accomplished without departing from the scope of this disclosure.

Figure 7:
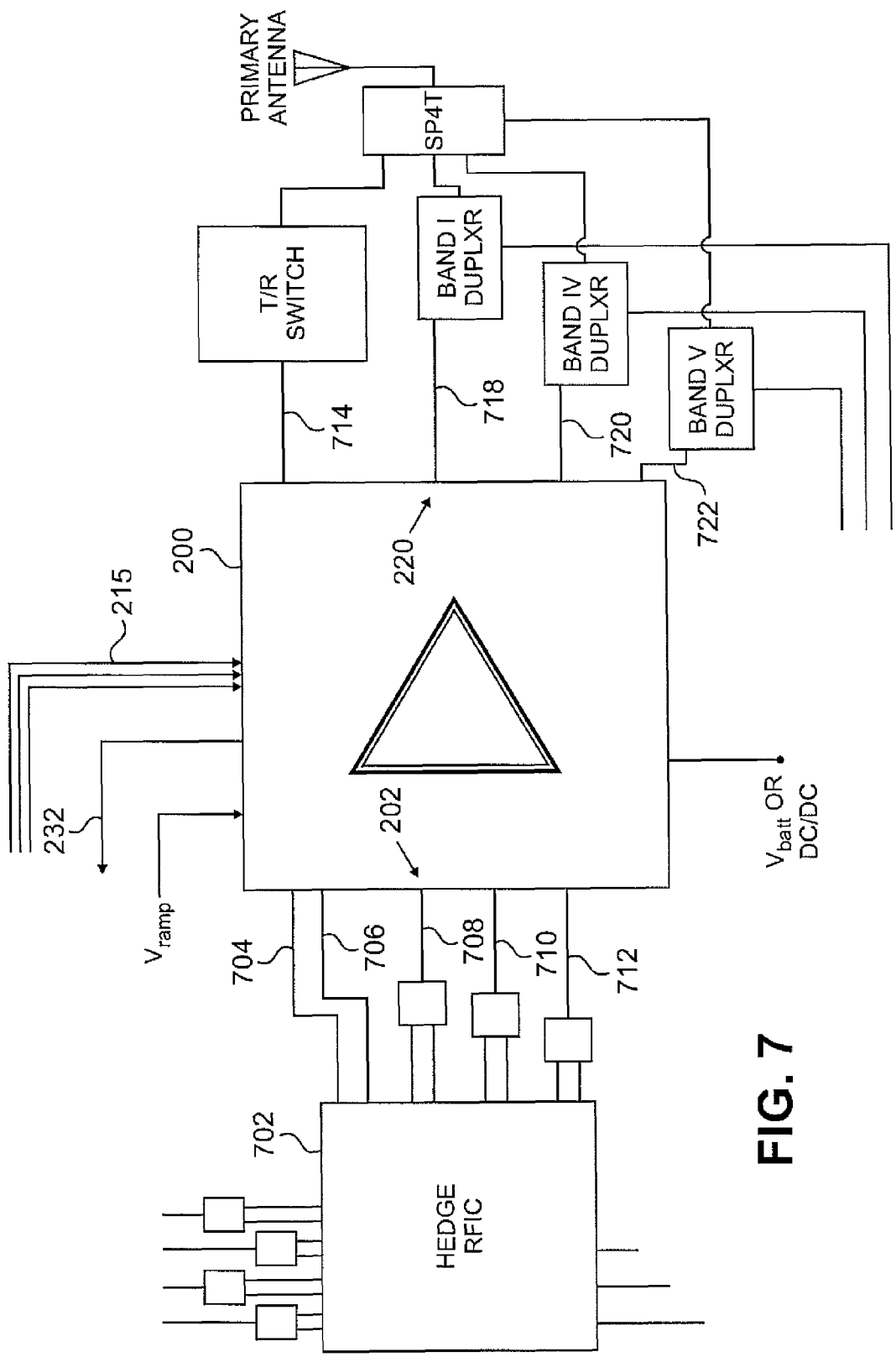
FIG. 7 illustrates a schematic diagram of the connections to a tunable power amplifying module according to an exemplary embodiment of the disclosure.

Referring now to FIG. 7, an exemplary block diagram of the connections to a tunable PA Module according to embodiments of the present disclosure is illustrated. The tunable PA module 200 has a plurality of interfaces for communicating with other components of the handset. In such embodiment, one integrated substrate module comprising a tunable PA module 200 is utilized in place of the multiple fixed PA systems.

The handset includes a HEDGE (HSDPA/WCDMA/EDGE) RFIC transceiver 702. The HEDGE RFIC 702 outputs a plurality of signal types, including, but not limited to, GSM High Band 704 ("HB") and GSM Low Band 706 ("LB") signals as well as WCDMA Band I 708, Band IV 710 and Band V 712 signals.

The tunable PA module 200 is configured to receive each of the plurality of signal types, e.g., the GSM High Band 704 ("HB"), the GSM Low Band 706 ("LB"), and the WCDMA Band I 708, Band IV 710 and Band V 712 signals, via the first interface 202. The tunable PA module 200 is further configured to output an amplified signal to a plurality of output paths via the second interface 220. The plurality of output paths may include, but is not limited to, a GSM path 714, a WCDMA Band I path 718, a WCDMA Band IV path 720 and a WCDMA Band V path 722.

Figure 8:
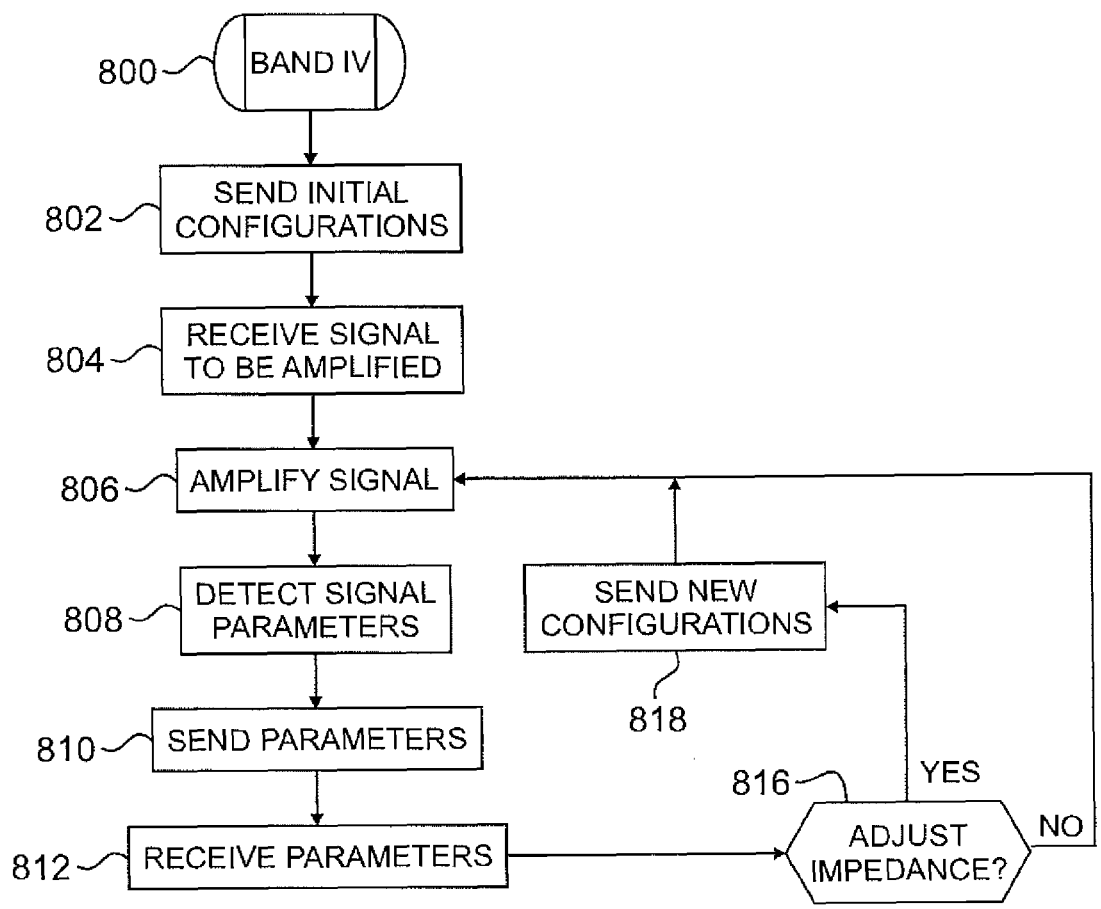
FIG. 8 is a flow diagram illustrating the operation of a wireless handset device including a tunable power amplifying module according to an exemplary embodiment of the disclosure.

Referring now to FIG. 8, a simple block diagram for the operation of the tunable PA module in an exemplary environment according to embodiments of the present disclosure is illustrated. The handset enters a WCDMA Band IV environment in step 800. When the handset is required to operate in a WCDMA Band IV environment, the processor transmits, in step 802, a plurality of configuration signals to the tunable PA module 200. The plurality of configurations signals includes an impedance configuration signal to set the impedances of each of the TMNs 212 and 218 to a value required to transmit the WCDMA Band IV signal. The plurality of configuration signals further includes a control signal to set the first interface 202 to receive the Band IV signal 710 and to set the second interface 220 to output the amplified signal along the WCDMA Band IV path 720.

The tunable PA module 200 receives the Band IV input signal 710 in step 804 and processes the signal via the amplifying path 210 (illustrated in FIG. 2) in step 806. Moving to step 808, the tunable PA module 200 outputs the amplified signal via the second interface 220 to the WCDMA Band IV path 720. Concurrently in step 810, the detector circuit 228 senses the parameters of the amplified version of the Band IV signal 710. Thereafter in step 812, the detector circuit 228 transmits the sensed parameters via the detector interface 232 to the processor.

The processor receives the parameters in step 814. The processor executes instructions and algorithms necessary to compute an optimal impedance setting based on the sensed parameters. If the processor determines that the impedance needs to be adjusted in step 816, the process moves to step 818 wherein the processor sends another set of configuration signals to the tunable PA module 200. However, if in step 816, the processor determines no adjustment is to impedance is necessary, the process moves back to step 806 wherein the tunable PA module 200 continues to amplify received signals and the detector circuit 228 continues to provide real time feedback of the parameters of the amplified signal.

Accordingly, depending upon the configuration of the first and second interfaces 202 and 220, the number and settings of the TMNs 212, 218 and 502, the settings of the broadband PA 208 and final PA 216 and the setting of the bypass switch 226, embodiments of the present disclosure are operable to tune the impedance value of the power amplifier a universal amplifying path 210 to yield a multi-mode multi-band power amplifier.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A device for amplifying a signal in a wireless communications handset, said device comprising:
   a first interface configured to receive an input signal;
   a first stage power amplifier, said first power amplifier comprising an input coupled to said first interface, and an output;
   a first tunable matching network, said first tunable matching network comprising a first input coupled to said output of said first stage power amplifier;
   a second stage power amplifier, said second stage power amplifier comprising an input coupled to an output of said first tunable matching network, and an output;
   a second tunable matching network, said second tunable matching network comprising an input coupled to said output of said second stage power amplifier; and
   a second interface coupled to an output of said second tunable matching network, said second interface configured to output an amplified version of said signal.

2. The device as set forth in claim 1, said device further comprising:
   a third interface coupled to a detector, said detector operable to transmit, via said third interface, at least one operating parameter of said amplified signal; and
   a fourth interface coupled to a decoder, said decoder configured to receive and decode at least one configuration signal via said fourth interface and output said decoded at least one configuration signal to at least one of said first and second tunable matching networks.

3. The device as set forth in claim 1, wherein at least one of said first and second tunable matching networks is a Micro-Electro-Mechanical System ("MEMS") device.

4. The device as set forth in claim 1, wherein said first interface is a single pole multi-throw interface adapted to receive said input signal from one of a plurality of signal sources and output a single pole signal to said first stage power amplifier.

5. The device as set forth in claim 1, wherein said second interface is a single pole multi-throw interface adapted to receive said amplified signal on a single pole terminal and output said amplified signal to one of a plurality of output paths.

6. The device as set forth in claim 1, further comprising a bypass switch configured to bypass said second stage power amplifier and at least one of said first tunable matching network and said second tunable matching network.

7. The device as set forth in claim 6, wherein said bypass switch is a Micro-Electro-Mechanical System ("MEMS") device.

8. A wireless communications handset comprising a plurality of transmission protocols for transmitting a plurality of signal types in a wireless communications network, each of said plurality of signal types capable of being amplified via a universal amplifying path, said universal amplifying path comprising:
   a multi-mode multi-band tunable power amplifier module, said multi-mode multi-band tunable power amplifier module comprising:
   a first interface configured to receive at least one of said plurality of signal types,
   a broadband amplifier stage configured to output a low power signal,
   a final amplifier stage configured to output a high power signal,
   a plurality of tunable matching networks configured to vary an impedance of said amplifying path,
   a second interface configured to output an amplified signal to one of a plurality of signal transmission paths, and
   a third interface; and
   a processor coupled to said third interface, said processor configured to cause said plurality of tunable matching networks to vary said impedance of said amplifying path.

9. The wireless communications handset as set forth in claim 8, further comprising:
   a computer readable medium coupled to said processor;
   a plurality of instructions wherein at least a portion of said plurality of instructions are storable in said computer readable medium, and further wherein said plurality of instructions are configured to cause said processor to perform the steps of:
   receiving a detect signal from a detector, wherein said detect signal comprises at least one parameter of said amplified signal;
   performing an algorithm to compute an optimal path impedance; and
   outputting a configuration signal to at least one of said plurality of tunable matching networks to vary said impedance.

10. The wireless communications handset as set forth in claim 8, wherein said final amplifier stage is coupled between a first one of said plurality of tunable matching networks and a second one of said tunable matching networks.

11. The wireless communications handset as set forth in claim 8, wherein said broadband amplifier stage is coupled between a third one of said plurality of tunable matching networks and a first one of said tunable matching networks.

12. The wireless communications handset as set forth in claim 8, said multi-mode multi-band tunable power amplifier module further comprising a bypass switch configured to bypass said final amplifier stage and at least one of said plurality of tunable matching networks.

13. The wireless communications handset as set forth in claim 12, wherein said bypass switch is a Micro-Electro-Mechanical System ("MEMS") device.

14. The wireless communications handset as set forth in claim 8, wherein at least one of said plurality of tunable matching networks is a Micro-Electro-Mechanical System ("MEMS") device.

* * * * *